US012770826B2

(12) United States Patent
Matsumoto

(10) Patent No.: US 12,770,826 B2
(45) Date of Patent: Oct. 20, 2026

(54) PLASMA CONTROL METHOD, PLASMA PROCESSING APPARATUS AND PLASMA PROCESSING SYSTEM

(71) Applicant: Tokyo Electron Limited, Tokyo (JP)

(72) Inventor: Yohei Matsumoto, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 114 days.

(21) Appl. No.: 18/917,083

(22) Filed: Oct. 16, 2024

(65) Prior Publication Data

US 2025/0140524 A1 May 1, 2025

(30) Foreign Application Priority Data

Oct. 25, 2023 (JP) ................................. 2023-183071

(51) Int. Cl.
*H01J 37/32* (2006.01)

(52) U.S. Cl.
CPC .. *H01J 37/32174* (2013.01); *H01J 37/32146* (2013.01); *H01J 37/32155* (2013.01); *H01J 37/3244* (2013.01); *H01J 2237/332* (2013.01)

(58) Field of Classification Search
None
See application file for complete search history.

(56) References Cited

U.S. PATENT DOCUMENTS 8,954,184 B2 * 2/2015 Kaushal ........... G05B 19/41875 73/1.01
9,299,540 B2 * 3/2016 Ogi ................... H01J 37/32926
10,043,690 B2 * 8/2018 Kapoor ............. H01J 37/32082
2008/0311688 A1 * 12/2008 Yamashita ............ G06F 30/367 716/136
2011/0070665 A1 * 3/2011 Chen ................. H01J 37/32935 257/E21.528
2011/0174606 A1 * 7/2011 Funk ................... H01J 37/3244 422/105
2011/0239167 A1 * 9/2011 Rathsack ................ G03F 7/705 716/50
2012/0091097 A1 * 4/2012 Chen ................. H01J 37/32926 156/345.28
2013/0327272 A1 * 12/2013 Augustyniak ..... C23C 16/45565 118/712
2015/0001181 A1 * 1/2015 Ogi ................... H01J 37/32926 156/345.27
2015/0118858 A1 * 4/2015 Takaba .............. H01J 37/32192 438/719

(Continued)

FOREIGN PATENT DOCUMENTS

JP 2021-180215 A 11/2021

*Primary Examiner* — Srinivas Sathiraju
(74) *Attorney, Agent, or Firm* — Venjuris P.C.

(57) ABSTRACT

A plasma control method includes: providing a plasma processing apparatus including a control unit and a process unit, receiving an input of a recipe in which values of a plurality of parameters are set for each processing step; determining a value of a variable parameter based on a progress state of the film forming processing when the plurality of parameters of the recipe include the variable parameter; and performing a film forming processing in the process unit based on the values of the plurality of parameters set in the recipe and the determined value of the variable parameter determined in the determining.

9 Claims, 9 Drawing Sheets

(56) References Cited

U.S. PATENT DOCUMENTS

| | | | | |
|---|---|---|---|---|
| 2016/0293385 | A1* | 10/2016 | Kapoor | H01J 37/32082 |
| 2017/0314132 | A1* | 11/2017 | Kim | H01J 37/32532 |
| 2018/0005801 | A1* | 1/2018 | Singhal | H01J 37/32091 |
| 2018/0158652 | A1* | 6/2018 | Shinagawa | G01N 21/73 |
| 2018/0158657 | A1* | 6/2018 | Shinagawa | G01N 21/73 |
| 2018/0358205 | A1* | 12/2018 | Long | H01J 37/3244 |
| 2019/0006186 | A1* | 1/2019 | Sato | H01J 37/32449 |
| 2019/0098740 | A1* | 3/2019 | Yamazawa | H01J 37/3211 |
| 2019/0103254 | A1* | 4/2019 | Lane | H01J 37/321 |
| 2020/0027706 | A1* | 1/2020 | Jing | G05B 19/418 |
| 2020/0081423 | A1* | 3/2020 | Clark | G05B 13/027 |
| 2020/0083074 | A1* | 3/2020 | Clark | G05B 13/027 |
| 2020/0083080 | A1* | 3/2020 | Clark | G05B 13/027 |
| 2020/0227326 | A1* | 7/2020 | Oikawa | C23C 14/34 |
| 2020/0365367 | A1* | 11/2020 | Yoshino | H01J 37/32091 |
| 2021/0074513 | A1* | 3/2021 | Van Zyl | H01J 37/32146 |
| 2021/0217587 | A1* | 7/2021 | Savas | C23C 16/505 |
| 2021/0225615 | A1* | 7/2021 | Yoshida | H01J 37/32082 |
| 2021/0351005 | A1* | 11/2021 | Kobayashi | C23C 16/402 |
| 2021/0384009 | A1* | 12/2021 | Kawakami | H01J 37/32174 |
| 2021/0407767 | A1* | 12/2021 | Tanaka | H01J 37/16 |
| 2022/0115208 | A1* | 4/2022 | Kaneko | H01J 37/32165 |
| 2022/0189741 | A1* | 6/2022 | Piumi | C23C 16/045 |
| 2022/0199371 | A1* | 6/2022 | Kumakura | B05D 1/62 |
| 2022/0336191 | A1* | 10/2022 | Hao | C23C 16/45565 |
| 2022/0372624 | A1* | 11/2022 | Matsumoto | C23C 16/402 |
| 2022/0403511 | A1* | 12/2022 | Yamazaki | C23C 16/4412 |
| 2022/0411928 | A1* | 12/2022 | Nakaya | C23C 16/04 |
| 2023/0057145 | A1* | 2/2023 | Shimizu | H01J 37/3244 |
| 2023/0075152 | A1* | 3/2023 | Samuels | H01J 37/32174 |
| 2023/0101063 | A1* | 3/2023 | Liu | C23C 16/308 |
| | | | | 438/786 |
| 2023/0187189 | A1* | 6/2023 | Jung | C23C 16/509 |
| | | | | 219/121.59 |
| 2024/0030008 | A1* | 1/2024 | Kamata | H01J 37/3222 |
| 2024/0136160 | A1* | 4/2024 | Ye | H01J 37/32183 |
| 2024/0234105 | A9* | 7/2024 | Ye | H01J 37/32183 |
| 2025/0140524 | A1* | 5/2025 | Matsumoto | H01J 37/32926 |

* cited by examiner

FIG. 7

1000

| | STEP 1 | STEP 2 | STEP 3 | STEP 4 | STEP 5 | STEP 6 |
|---|---|---|---|---|---|---|
| END CONDITION | TIME | TIME | TIME | TIME | TIME | END |
| TIME 秒 | 20.0 | 20.0 | VARIABLE PARAMETER | 20.0 | 20.0 | 0.0 |
| TYPE OF FILM FORMING | | 1012 | OPTION | 1010 | | |
| L19: He/Ar FLOW RATE SCCM | 300.0 | 300.0 | 300.0 | 300.0 | 0.0 | 0.0 |
| L24: LTO520 FLOW RATE SCCM | 0.0 | 0.0 | 0.0 | 0.0 | 0.0 | 0.0 |
| L25: LTO520 FLOW RATE SCCM | 0.00 | 0.00 | 0.00 | 0.00 | 0.00 | 0.00 |
| L26: LTO520 FLOW RATE SCCM | 0.00 | 0.00 | 0.00 | 0.00 | 0.00 | 0.00 |
| L27: $H_2$ FLOW RATE SCCM | 0.0 | 0.0 | 0.0 | 0.0 | 0.0 | 0.0 |
| L29: $NH_3$ FLOW RATE SCCM | 10.0 | 10.0 | 10.0 | 10.0 | 0.0 | 0.0 |
| L31: $NF_3$ FLOW RATE SCCM | 0.0 | 0.0 | 0.0 | 0.0 | 0.0 | 0.0 |
| L32: $NF_3$ FLOW RATE SCCM | 0.0 | 0.0 | 0.0 | 0.0 | 0.0 | 0.0 |
| L38: $NH_3$ FLOW RATE SCCM | 0.00 | 0.00 | 0.00 | 0.00 | 0.00 | 0.00 |
| L39: $NH_3$ FLOW RATE SCCM | 0.00 | 0.00 | 0.00 | 0.00 | 0.00 | 0.00 |
| L40: $N_2$-1 FLOW RATE SCCM | 0.0 | 0.0 | 0.0 | 0.0 | 0.0 | 0.0 |
| L41: $O_2$ FLOW RATE SCCM | 200.0 | 200.0 | 200.0 | 200.0 | 0.0 | 0.0 |
| L42: $O_2$ FLOW RATE SCCM | 50.0 | 50.0 | 50.0 | 50.0 | 0.0 | 0.0 |
| L43: $O_2$ FLOW RATE SCCM | 50.0 | 50.0 | 50.0 | 50.0 | 0.0 | 0.0 |

PLASMA CONTROL METHOD, PLASMA PROCESSING APPARATUS AND PLASMA PROCESSING SYSTEM

CROSS-REFERENCE TO RELATED APPLICATIONS

This application is based on and claims priority from Japanese Patent Application No. 2023-183071 filed on Oct. 25, 2023 with the Japan Patent Office, the disclosure of which is incorporated herein in its entirety by reference.

TECHNICAL FIELD

The present disclosure relates to a plasma control method, a plasma processing apparatus, and a plasma processing system.

BACKGROUND

A plasma processing apparatus including a rotary table that is rotatably installed in a vacuum container and has a plurality of substrates disposed thereon, a plasma processing gas supply unit that supplies a plasma processing gas to a processing area, and an antenna that generates a plasma in the processing area, has been known in the related art. Japanese Patent Application Laid-Open No. 2021-180215 discloses a plasma processing apparatus that supplies a plasma processing gas into a vacuum container while rotating a rotary table, and supplies pulses of RF power to an antenna.

SUMMARY

An aspect of the present disclosure provides a plasma control method of a plasma processing apparatus including a control unit and a process unit. The plasma control method, by the control unit, includes receiving an input of a recipe in which values of a plurality of parameters are set for each processing step; determining a value of a variable parameter based on a progress state of the film forming processing when the plurality of parameters of the recipe includes the variable parameter; and performing a film forming processing in the process unit based on the values of the plurality of parameters set in the recipe and the value of the variable parameter determined in the determining.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7 is an image diagram of an example of a recipe setting screen.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the accompanying drawings. In the specification and drawings, illustrations and descriptions of parts which are unnecessary to the description of the present embodiments are omitted as appropriate.

Example of Configuration

Figure 1:
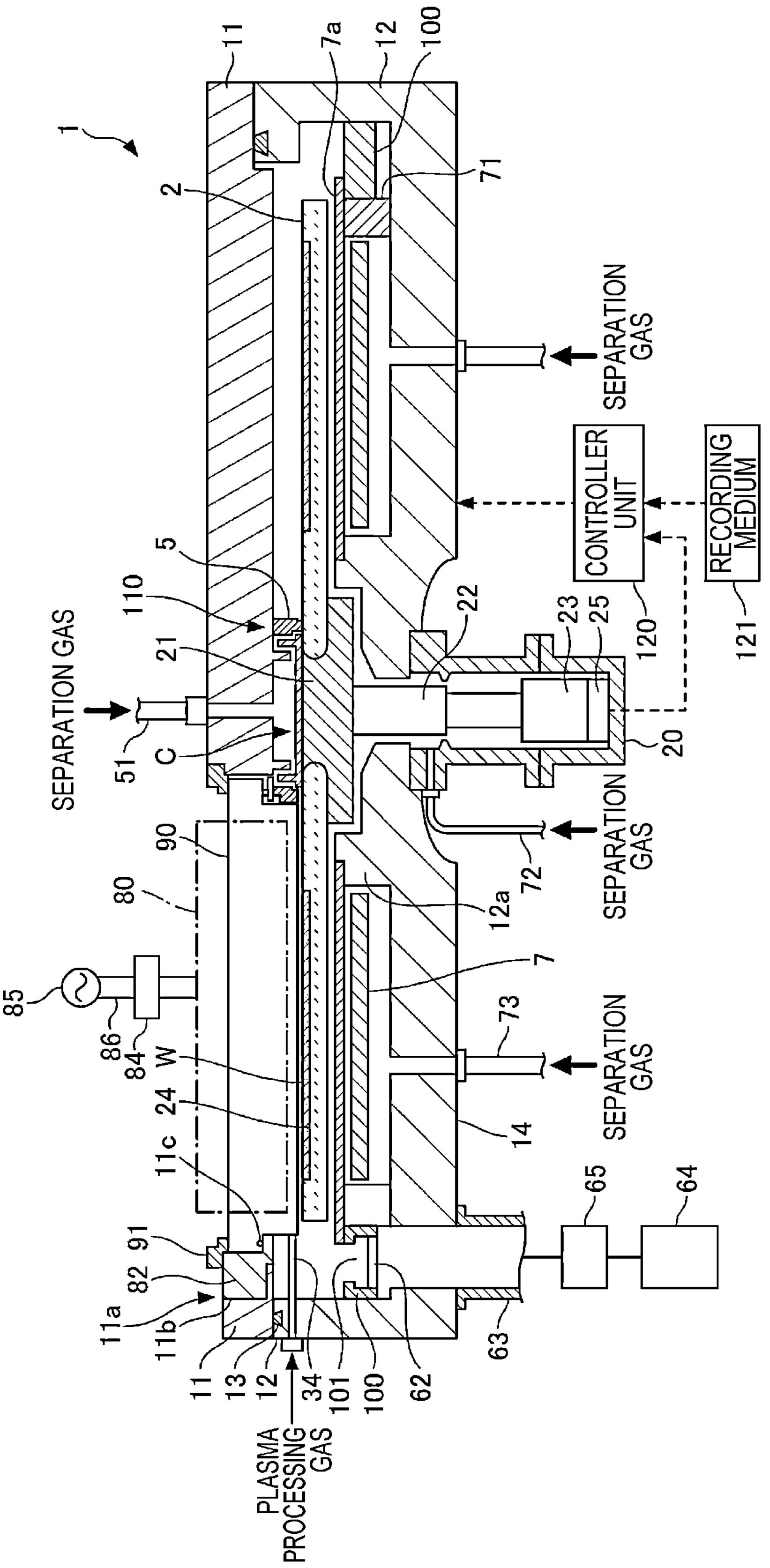
FIG. 1 is a cross-sectional view illustrating a configuration of a plasma processing apparatus according to an embodiment of the present disclosure.

FIG. 1 is a cross-sectional view illustrating a configuration of a plasma processing apparatus according to an embodiment of the present disclosure. The plasma processing apparatus illustrated in FIG. 1 includes a vacuum container 1 having a substantially circular planar shape, and a rotary table 2 installed within the vacuum container 1 and having a center of rotation at the center of the vacuum container 1 while rotating a wafer W.

The vacuum container 1 is a processing chamber for accommodating a wafer W to perform a film forming processing on a surface of the wafer W and deposit a thin film thereon. The vacuum container 1 includes a ceiling plate 11 installed at a position facing a concave portion 24 of the rotary table 2, to be described below, and a container body 12. A sealing member 13 formed in an annular shape is installed on a circumferential edge of an upper surface of the container body 12.

A top plate 11 is configured to be detachable from the container body 12. A diameter (inner diameter) of the vacuum container 1 when viewed from a plan view is not limited. The diameter of the vacuum container 1 may be, for example, about 1100 mm.

A separation gas supply pipe 51 is connected to a central portion of an upper surface inside the vacuum container 1 to supply a separation gas in order to suppress mixing of different processing gases in a central area C within the vacuum container 1.

The rotary table 2 is fixed to a core portion 21 having a substantially cylindrical shape at the center thereof, and is configured to freely rotate about a rotation axis 22 that is connected to a lower surface of the core portion 21 and extends in a vertical direction, around a vertical axis (e.g., in a clockwise direction) by a driving unit 23. A diameter of the rotary table 2 is not limited. The diameter of the rotary table 2 may be, for example, about 1000 mm.

The driving unit 23 is provided with an encoder 25 that detects a rotation angle of the rotation axis 22. In the present embodiment, the rotation angle of the rotation axis 22 detected by the encoder 25 is transmitted to a controller unit 120, and is used by the controller unit 120 to specify a position of the wafer W disposed in each concave portion 24 on the rotary table 2.

The rotation shaft 22 and the driving unit 23 are accommodated in a case body 20. The case body 20 has a flange portion on an upper surface thereof, which is hermetically attached to a lower surface of a bottom surface portion 14 of the vacuum container 1. A purge gas supply pipe 72 for supplying Ar gas serving as a purge gas (separation gas) to a lower area of the rotary table 2, is connected to the case body 20.

An outer periphery of the core portion 21 in the bottom surface portion 14 of the vacuum container 1 is formed in an annular shape so as to approach the rotary table 2 from a lower portion, thereby forming a protrusion 12*a*.

The concave portion 24 having a circular shape is formed in a surface of the rotary table 2 to place a wafer W having a diameter of, for example, 300 mm. The concave portion 24 is provided at a plurality of points, for example, six points, along a rotation direction of the rotary table 2. The concave portion 24 has an inner diameter that is slightly greater than the diameter of the wafer W, for example, by about 1 mm to 4 mm. A depth of the concave portion 24 is configured to be approximately equal to a thickness of the wafer W, or greater than the thickness of the wafer W. Therefore, when the wafer W is accommodated in the concave portion 24, the surface of the wafer W and a surface of a flat area of the rotary table 2 where the wafer W is not disposed become the same height, or the surface of the wafer W becomes lower than the surface of the rotary table 2. In addition, through-holes (not illustrated) through which, for example, three lifting pins for pushing and lifting the wafer W from the lower portion are passed, are formed in a bottom surface of the concave portion 24.

The vacuum container 1 includes a plurality of processing areas, which are provided to be spaced apart from each other along the rotation direction of the rotary table 2. At a position facing a passage area of the concave portion 24 in the rotary table 2, a plurality of gas nozzles (e.g., gas nozzles 34) made of, for example, quartz are disposed radially to be spaced apart from each other in a circumferential direction of the vacuum container 1. Each of the gas nozzles is disposed between the rotary table 2 and the ceiling plate 11. Each of the gas nozzles is attached to extend horizontally from an outer circumferential wall of the vacuum container 1 toward the central area C so as to face the rotary table 2, for example. The gas nozzle may extend from the outer circumferential wall of the vacuum container 1 toward the central area C and then, bend and extend in a counterclockwise direction (e.g., in a direction opposite to the rotation direction of the rotary table 2) to linearly follow the central area C.

For example, in the vacuum container 1, a plasma processing gas nozzle, a separation gas nozzle, a first processing gas nozzle, a separation gas nozzle, and a second processing gas nozzle are disposed in this order in a clockwise direction (e.g., a rotation direction of the rotary table 2) from a transfer port.

A gas supplied by the second processing gas nozzle may be often a gas of the same quality as a gas supplied by the plasma processing gas nozzle. However, when the gas is sufficiently supplied by the plasma processing gas nozzle, it is not necessary to install the second processing gas nozzle.

The plurality of gas nozzles are connected to each of gas supply sources (not illustrated) through a flow adjustment valve. On a lower surface side (e.g., a side facing the rotary table 2) of the plurality of gas nozzles, gas ejection holes for ejecting each gas are formed at a plurality of points, for example, at equal intervals, along a radial direction of the rotary table 2. A distance between a lower edge of each gas nozzle and an upper surface of the rotary table 2 may be, for example, about 1 to 5 mm.

A lower area of the first processing gas nozzle is a first processing area for adsorbing a source gas to the wafer W. A lower area of the second processing gas nozzle is a second processing area for supplying an oxidizing gas capable of generating an oxide by oxidizing the source gas to the wafer W. In addition, a lower area of the plasma processing gas nozzle becomes a third processing area for performing a reforming processing of a film on the wafer W.

The first processing gas nozzle supplies a silicon-containing gas when forming a silicon oxide film or a silicon nitride film, and supplies a metal-containing gas when forming a metal oxide film or a metal nitride film. The first processing gas nozzle is a nozzle for supplying a source gas (precursor) containing a raw material which is a main component of a thin film. The first processing gas nozzle is also called a source gas nozzle. The first processing area is an area where the source gas is adsorbed onto the wafer W, and therefore, the first processing area is also called a source gas adsorption area.

The second processing gas nozzle supplies an oxidizing gas such as oxygen, ozone, water, or hydrogen peroxide to the wafer W when forming an oxide film, and therefore, the second processing gas nozzle is also called an oxidizing gas nozzle. The second processing area is an area for oxidizing the source gas adsorbed on the wafer W in the first processing area by supplying an oxidizing gas to the wafer W, and therefore, the second processing area is also called an oxidation area. In the oxidation area, a molecular layer of an oxide film is deposited on the wafer W.

The third processing area is an area for plasma-processing the molecular layer of the oxide film formed in the second processing area and reforming the oxide film, and therefore, the third processing area is also called a plasma processing area. In an embodiment, since an oxide film is formed, a plasma processing gas supplied from the plasma processing gas nozzle is, for example, a gas containing oxygen. However, when forming a nitride film, the plasma processing gas supplied from the plasma processing gas nozzle is, for example, a gas containing nitrogen.

The separation gas nozzle is installed to form separation areas that separate the first processing area and the second processing area, and the third processing area and the first processing area. The separation gas supplied from the separation gas nozzle includes an inert gas such as nitrogen, and a rare gas such as helium or argon. The separation gas is also called a purge gas nozzle. A separation area D is not provided between the second processing area and the third processing area. This is because, in an oxidizing gas supplied from the second processing area and a mixture gas supplied from the third processing area, an oxygen gas contained in the mixture gas includes oxygen atoms in common, and both the oxidizing gas and the oxygen gas function as oxidizers. In addition, this is because there is no need to separate the second processing area and the third processing area using the separation gas.

Since the plasma processing gas nozzle is configured to supply a gas to different areas on the rotary table 2, a flow rate ratio of each component of the mixture gas may be different for each area, so that a reforming processing is uniformly performed overall.

A plasma source 80 is installed on an upper side of the plasma processing gas nozzle to plasma-process the plasma processing gas ejected into the vacuum container 1. The plasma source 80 generates an inductively coupled plasma using an antenna.

The plasma source 80 is configured by winding an antenna formed of a metal line in a coil shape, for example, three times, around the vertical axis. The plasma source 80 is disposed to surround a belt-shaped area extending in a diameter direction of the rotary table 2 when viewed from a plan view, and also to span a diameter portion of the wafer W on the rotary table 2.

The antenna is connected to an RF power supply 85 having a frequency of, for example, 13.56 MHz through a matching unit 84. The antenna is installed to be hermetically separated from an internal area of the vacuum container 1. A connection electrode 86 electrically connects the antenna and the matching unit 84 and the RF power supply 85. The antenna may be configured to be bent vertically, or may include a vertical movement mechanism that may automatically bend the antenna vertically, and a mechanism that may vertically move a point on the center of the rotary table 2, if necessary.

An opening 11*a* that is opened in a roughly fan-shape when viewed from a plan view is formed in the ceiling plate 11 on an upper portion of the plasma processing gas nozzle. The opening 11*a* has an annular member 82 that is hermetically installed in the opening 11*a* along an opening edge of the opening 11*a*. A housing 90 is hermetically installed on an inner circumferential surface of the annular member 82. That is, the annular member 82 is hermetically installed such that its outer circumference comes into contact with an inner circumferential surface 11*b* of the opening 11*a* of the ceiling plate 11 and its inner circumference comes into contact with a flange portion of the housing 90.

Through the annular member 82, the housing 90, made of a guide member, such as, for example, a quartz, is installed in the opening 11*a* to position the antenna at a portion lower than the ceiling plate 11. A bottom surface of the housing 90 constitutes the ceiling surface of the plasma processing area.

The housing 90 is formed such that an upper peripheral edge thereof extends horizontally in a flange shape in a circumferential direction to form a flange portion, and a central portion thereof is recessed toward an inner area of the vacuum container 1 on a lower portion when viewed from a plan view. The housing 90 is disposed to span the diameter portion of the wafer W in the diameter direction of the rotary table 2 when the wafer W is positioned in a lower portion of the housing 90. A sealing member 11*c* such as an O-ring is installed between the annular member 82 and the ceiling plate 11.

An internal atmosphere of the vacuum container 1 is set to be airtight by the annular member 82 and the housing 90. For example, the annular member 82 and the housing 90 are fitted into the opening 11*a*, and then, the housing 90 is pressed downward in the circumferential direction by a pressing member 91 formed in a frame shape to follow upper surfaces of the annular member 82 and the housing 90 and a contact portion of the annular member 82 and the housing 90. In addition, the pressing member 91 is fixed to the ceiling plate 11 by a bolt (not illustrated). Accordingly, the internal atmosphere of the vacuum container 1 is set to be airtight.

A lower surface of the housing 90 is provided with a protrusion that extends vertically toward the rotary table 2 so as to surround the plasma processing area on the lower portion of the housing 90 along the circumferential direction. In an area surrounded by an inner peripheral surface of the protrusion, the lower surface of the housing 90, and the upper surface of the rotary table 2, the plasma processing gas nozzle is accommodated. In addition, a protrusion at a base end of the plasma processing gas nozzle (e.g., an inner wall side of the vacuum container 1) is cut-out in a substantially circular arc shape to follow an outer shape of the plasma processing gas nozzle. On the lower portion of the housing 90 (e.g., a plasma processing area), a protrusion is formed in the circumferential direction.

The seal member 11*c* is not directly exposed to a plasma by the protrusion. For example, the seal member 11*c* is isolated from the plasma processing area. Therefore, even when the plasma from the plasma processing area attempts to diffuse toward the seal member 11*c*, for example, the plasma passes through a lower portion of the protrusion, so that the plasma is deactivated before reaching the seal member 11*c*. In addition, a plasma processing gas nozzle is installed in the third processing area of the lower portion of the housing 90 and is connected to an argon gas supply source, a hydrogen gas supply source, an oxygen gas supply source, and an ammonia gas supply source. However, either the hydrogen gas supply source or the ammonia gas supply source may be installed, and it is not necessary to install both of them.

A flow controller corresponding to each of the plasma processing gas nozzle and the argon gas supply source, the hydrogen gas supply source, the oxygen gas supply source, and the ammonia gas supply source is installed therebetween. The argon gas supply source, the hydrogen gas supply source, the oxygen gas supply source, and the ammonia gas supply source supply Ar gas, $H_2$ gas, $O_2$ gas, and $NH_3$ gas to the plasma processing gas nozzle, respectively. The flow rates of the Ar gas, $H_2$ gas, $O_2$ gas, and $NH_3$ gas are controlled by each of the flow controllers and supplied to the plasma processing gas nozzle at a predetermined flow rate ratio (e.g., a mixing ratio). However, when only one of the hydrogen gas supply source and the ammonia gas supply source is installed, a flow controller is installed to match with one side of the installed gas supply source. For example, a mass flow controller may be used for the flow controller. When one plasma processing gas nozzle is provided, for example, the above-mentioned Ar gas, $H_2$ gas, or a mixture gas of $NH_3$ gas and $O_2$ gas is supplied to the one plasma processing gas nozzle.

During a plasma processing, since the rotary table 2 rotates in the clockwise direction, Ar gas attempts to penetrate into the lower portion of the housing 90 from a gap between the rotary table 2 and the protrusion according to the rotation of the rotary table 2. Therefore, in order to prevent the penetration of Ar gas into the lower portion of the housing 90 through the gap, the gas is ejected from the lower portion of the housing 90 with respect to the gap.

Hereinafter, in order to facilitate distinction, the plasma processing gas nozzle is sometimes referred to as a gas nozzle (e.g., a base nozzle) for supplying a plasma processing gas to the entire surface of the wafer W, a gas nozzle (e.g., an outer nozzle) for supplying a plasma processing gas mainly to an outer area of the wafer W, and a gas nozzle (e.g., an axial nozzle) for supplying a plasma processing gas mainly to the central area near an axial side of the rotary table 2 of the wafer W. In addition, in the case of using only one plasma processing gas nozzle, it is necessary to install only a base nozzle.

On an outer circumferential side of the rotary table 2, a cover chain side ring 100 is disposed at a position lower than the rotary table 2. On an upper surface of the cover chain side ring 100, exhaust ports 62 are formed to be spaced apart from each other in the circumferential direction.

The exhaust ports 62 exhaust a gas such as a processing gas, a plasma processing gas, or a separation gas. The exhaust ports 62 are connected to a vacuum exhaust mechanism, such as a vacuum pump 64, by an exhaust pipe 63 to which a pressure adjustment unit 65 such as a butterfly valve is interposed. On the upper surface of the cover chain side ring 100 on an outer circumference of the housing 90, a groove-shaped gas path 101 for gas flow is formed.

In a central portion of a lower surface of the top plate 11, a protrusion 5 is provided, which is formed in a substantially circular shape in the circumferential direction in a continuous manner with a region of the central area C of a convex portion, and whose lower surface is formed at the same height as a lower surface of the convex portion. On an upper portion of the core portion 21 on the center of rotation of the rotary table 2 relative to the protrusion 5, a labyrinth structure 110 is disposed to suppress the mixing of various gases in the central area C.

Since the housing 90 is formed up to a position biased toward the central area C, the core portion 21 supporting the central portion of the rotary table 2 is formed on the center of the rotation so that an upper portion of the rotary table 2 avoids the housing 90. Therefore, on the central area C, various gases are more likely to mix with each other than, on the outer circumferential edge. Therefore, by forming the labyrinth structure 110 on the upper portion of the core portion 21, a gas path may be secured, and mixing of gases may be prevented.

A heater unit 7, which is a heating mechanism, is installed in a space between the rotary table 2 and the bottom surface portion 14 of the vacuum container 1. The heater unit 7 is configured to heat the wafer W on the rotary table 2 to, for example, room temperature to about 700° C. through the rotary table 2.

In addition, in the heater unit 7, a cover member 71 is installed on a lateral side thereof, and a cover member 7*a* covering an upper side thereof is installed. On the bottom surface portion 14 of the vacuum container 1, a purge gas supply pipe 73 for purging a space where the heater unit 7 is disposed is installed at multiple points in the circumferential direction, in the lower portion of the heater unit 7.

On a sidewall of the vacuum container 1, a transfer port is formed to transfer the wafer W between a transfer arm and the rotary table 2. The transfer port is configured to be freely opened and closed hermetically by a gate valve G.

In the concave portion 24 of the rotary table 2, the wafer W is transferred between the transfer arm and the rotary table at a position facing the transfer port. Thus, at a point corresponding to a conveying position in the lower portion of the rotary table 2, a lifting pin and a lifting mechanism (not illustrated) are installed to lift the wafer W from a back surface by penetrating the concave portion 24.

In addition, the plasma processing apparatus, according to the present embodiment, includes the controller unit 120 equipped with a computer that controls an operation of the entire apparatus. A storage unit of the controller unit 120 stores a program for performing film forming to be described below. The program is installed in the controller unit 120 from a recording medium 121 such as a hard disk, a compact disk, a magneto-optical disk, a memory card, or a flexible disk.

Plasma Control

Figure 2:
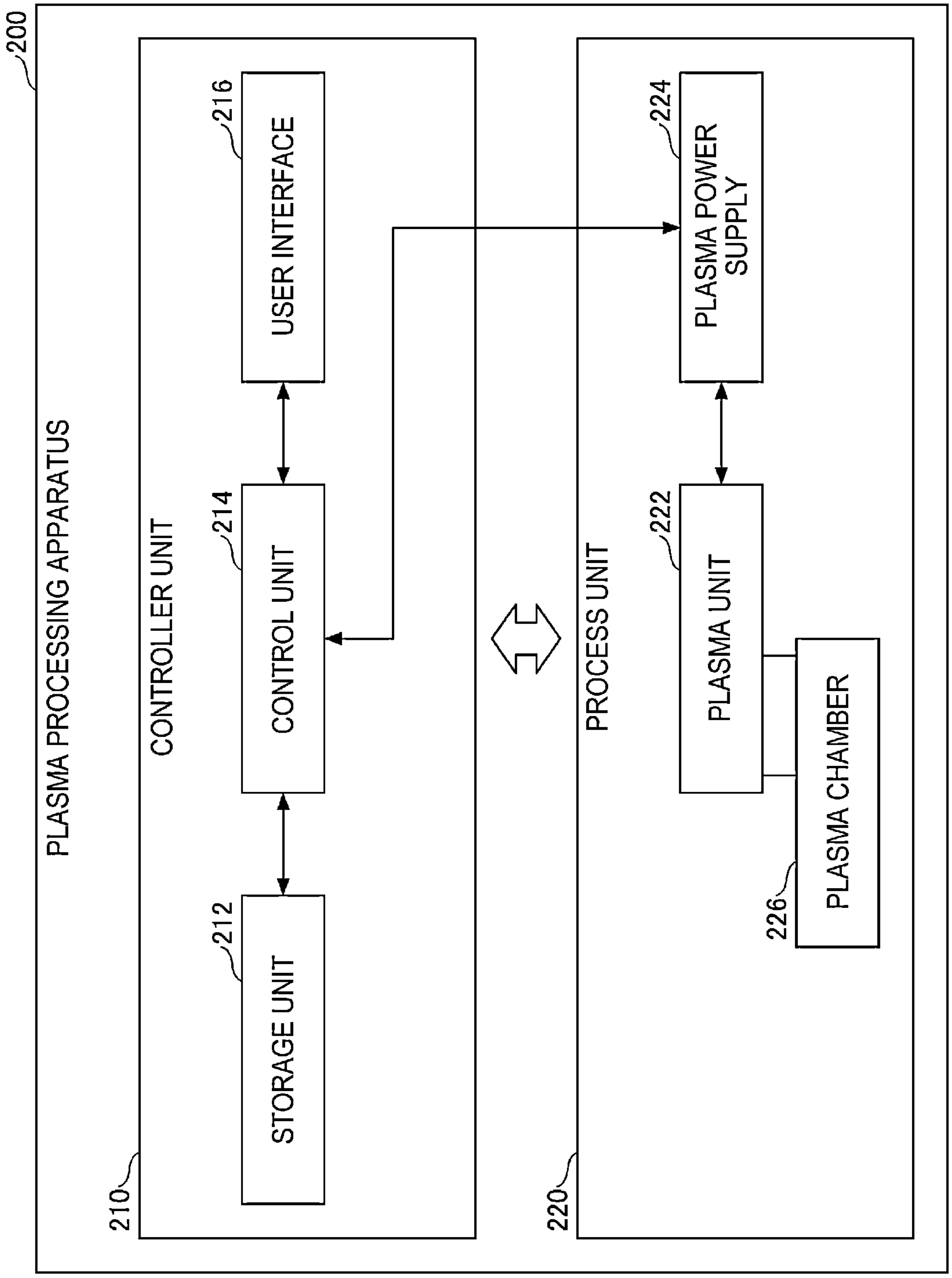
FIG. 2 is a block diagram illustrating a configuration of the plasma processing apparatus according to the present embodiment.

Hereinafter, a plasma control method according to an embodiment of the present disclosure will be described using a configuration diagram of FIG. 2, which schematically illustrates the plasma processing apparatus of FIG. 1. FIG. 2 is a block diagram illustrating a configuration of the plasma processing apparatus of the present embodiment. The block diagram of FIG. 2 omits parts that are unnecessary for the explanation of a plasma processing method according to the present embodiment.

A plasma processing apparatus 200 illustrated in FIG. 2 includes a controller unit 210 and a process unit 220. The controller unit 210 may be provided outside the plasma processing apparatus 200 and be connected through a communication path. The controller unit 210 corresponds to the controller unit 120 of FIG. 1. The process unit 220 corresponds to a configuration excluding the controller unit 120 and the recording medium 121 of FIG. 1.

The controller unit 210 includes a storage unit 212, a control unit 214, and a user interface 216. The process unit 220 includes a plasma unit 222, a plasma power supply 224, and a process chamber 226.

The storage unit 212 stores a program that controls an operation of the entire apparatus. By executing the program, the control unit 214 transmits a control signal to each unit for performing film forming in the process unit 220 and controls an operation of each unit.

The user interface 216 displays a screen for receiving an input of information from an operator and displays a screen for outputting information such as a result to the operator. For example, the user interface 216 displays a screen for receiving an input of information from an operator and receives an input of a recipe in which values of a plurality of parameters for performing a film forming processing in the process unit 220 are set for each processing step.

The recipe is an example of information in which a process sequence and control parameters of the plasma processing apparatus 200 are set. For example, in the recipe, control target values such as temperature, pressure, the type of gas, a gas flow rate, the time of a processing step, and radio-frequency (RF) power are set. The control unit 214 transmits a control signal to the process unit 220 to perform the film forming processing according to the input recipe.

The plasma power supply 224 of the process unit 220 is communicatively connected to the control unit 214 of the controller unit 210 in a wired or wireless manner. The plasma power supply 224 supplies pulses of RF power to the plasma unit 222 according to a control of the control unit 214. The plasma unit 222 generates a plasma within the process chamber 226 according to the pulses of RF power supplied from the plasma power supply 224.

For example, the control unit 214 controls a duty ratio or frequency of the pulse of the RF power supplied by the plasma power supply 224 to the plasma unit 222 according to the recipe. The detailed description of a processing of controlling the duty ratio or frequency of the pulse of the RF power of the plasma power supply 224 by the control unit 214 according to the recipe will be described below.

Figure 3:
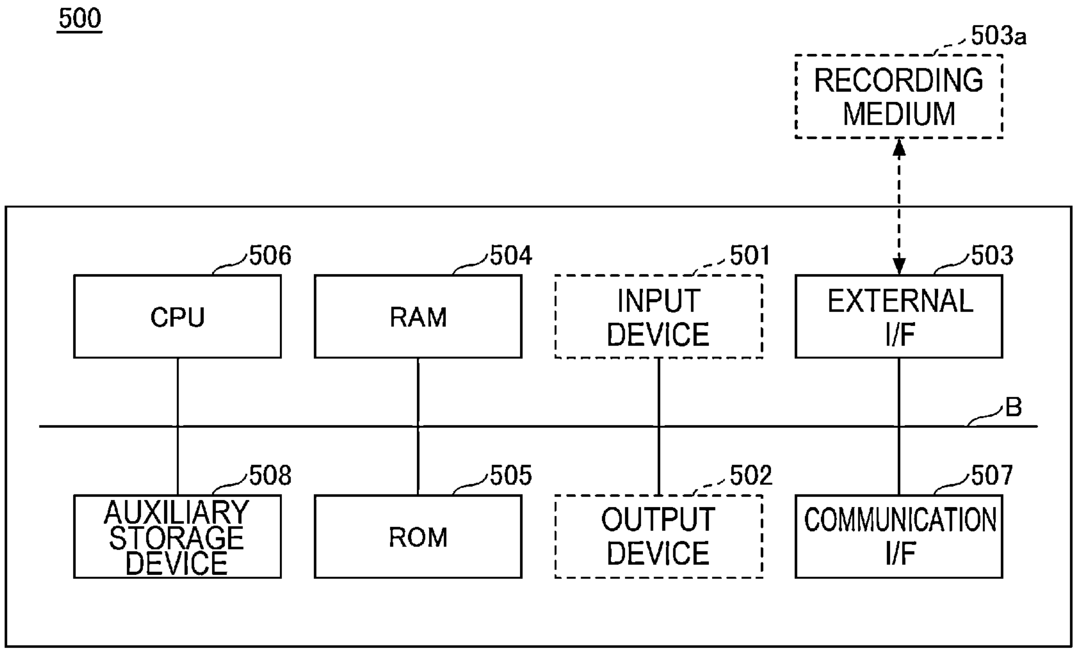
FIG. 3 is a hardware configuration diagram of a computer.

The controller unit 210 of the plasma processing apparatus 200 is implemented by, for example, a computer 500 having a hardware configuration illustrated in FIG. 3. FIG. 3 is a hardware configuration diagram of an example of a computer.

The computer 500 of FIG. 3 includes an input device 501, an output device 502, an external I/F (interface) 503, a random access memory (RAM) 504, a read only memory (ROM) 505, a central processing unit (CPU) 506, a communication I/F 507, and an auxiliary storage unit 508, each of which is connected by a bus B. The input device 501 and the output device 502 may be connected and used as needed. The auxiliary storage unit 508 is, for example, a hard disk drive (HDD) or a solid state drive (SSD).

The input device 501 is a keyboard, a mouse, or a touch panel and is used to input each operational signal by an operator. The output device 502 is a display and displays a result of a processing by the computer 500. The communication I/F 507 is an interface that connects the computer 500 to networks. The auxiliary storage unit 508 is a non-volatile storage unit that stores programs or data.

The external I/F 503 is an interface to an external device. The computer 500 may perform reading on a recording medium 503*a*, such as a secure digital (SD) memory card, via the external I/F 503. The ROM 505 is a non-volatile semiconductor memory (e.g., a storage unit) where programs and data are stored. The RAM 504 is a volatile semiconductor memory that temporarily holds programs and data.

The CPU 506 is a computing device that reads programs and data from the storage unit such as the ROM 505 or the auxiliary storage unit 508 and performs a processing to implement control and functions of the entire computer 500.

Figure 4:
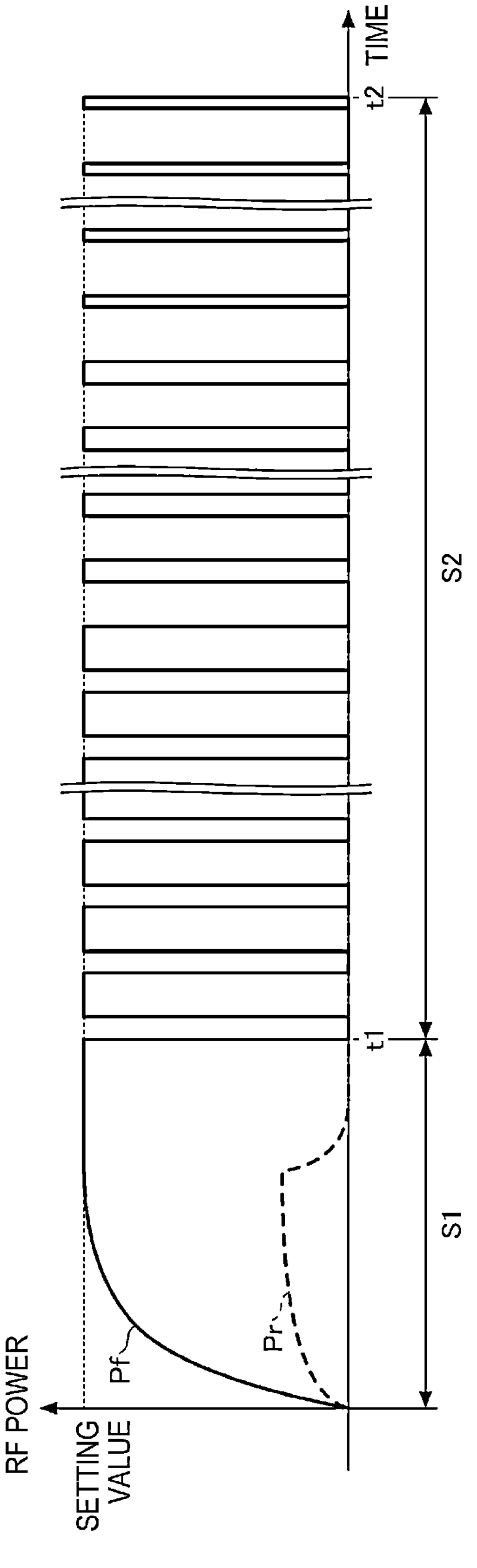
FIG. 4 is a diagram illustrating an output of RF power in a plasma power supply according to the present embodiment.

FIG. 4 is a diagram illustrating an example of an output of RF power in the plasma power supply according to the present embodiment. In FIG. 4, a horizontal axis represents time. In FIG. 4, a vertical axis represents the output of RF power output by the plasma power supply 224. A solid line represents forward power Pf sent from the plasma power supply 224 to a plasma load including an antenna. A dashed line represents reflected power Pr directed from the plasma load to the plasma power supply 224.

In a pretreatment of the film forming processing, the wafer W is heated to a predetermined temperature in a state where an inside of the vacuum container 1 is controlled to a predetermined pressure. At this time, a gas is supplied from the plurality of gas nozzles. This series of control operations is performed by the control unit 214.

The plasma unit 222 of the process unit 220 ignites a plasma (plasma ignition process S1). In the plasma ignition process S1, RF power is supplied from the plasma power supply 224 to the antenna of the plasma unit 222, thereby igniting and generating a plasma.

In FIG. 4, the RF power is supplied from the plasma power supply 224 to the antenna of the plasma unit 222 as a continuous wave (CW) of the RF power without pulse modulation. By supplying a continuous wave of the RF power from the plasma power supply 224 to the antenna of the plasma unit 222 when igniting the plasma, the plasma may be easily ignited.

Continuously, the process chamber 226 of the process unit 220 performs a process processing (process processing step S2). The process processing step S2 is performed after the plasma ignition step S1. A timing t1 for starting the process processing step S2 is determined based on at least one of the forward power Pf and the reflected power Pr. For example, the process processing step S2 may be started after the forward power Pf reaches a predetermined set value and stabilizes, or the process processing step S2 may be started after the reflected power Pr reaches a predetermined value (e.g., 100 W) or less.

In the process processing step S2, by the rotation of the rotary table 2, for example, a silicon-containing gas is adsorbed onto the first processing area on the surface of the wafer W, and then, the silicon-containing gas adsorbed on the wafer W is oxidized by ozone in the second processing area. Accordingly, a molecular layer of $SiO_2$, which is a thin film component, is formed in one or more layers and deposited on the wafer W. The wafer W reaches the plasma processing area, and a reforming processing of the silicon oxide film is performed by the plasma processing. In the plasma processing area, a plasma processing gas is supplied from the base nozzle, the outer nozzle, and the axial nozzle.

When necessary, based on a supply from the base nozzle, in an area near a central axis where an angular velocity is low and the amount of plasma processing tends to increase, a flow rate of oxygen may be decreased such that reforming power is lower than that of the plasma processing gas supplied from the base nozzle. Also, in an outer circumferential area where the angular velocity is high and the amount of plasma processing tends to be insufficient, the flow rate of oxygen may be increased so that the reforming power is higher than the plasma processing gas supplied from the base nozzle. Accordingly, the influence of the angular velocity of the rotary table 2 may be appropriately adjusted.

In this state, by continuing to rotate the rotary table 2, in the process chamber 226, the adsorption of the silicon-containing gas onto the surface of the wafer W, the oxidation of a silicon-containing gas component adsorbed onto the surface of the wafer W, and a plasma reforming of the silicon oxide film as a reaction product are performed multiple times. In this manner, in the process chamber 226, the film forming processing by an atomic layer deposition (ALD) method and a reforming processing of a formed film are performed multiple times by the rotation of the rotary table 2.

In the process processing step S2, a pulse (e.g., a pulse wave) that is obtained by pulse modulation of the RF power supplied to the antenna from the plasma power supply 224 is supplied. When the pulse of the RF power is supplied to the antenna from the plasma power supply 224, the energy distribution of ions and radicals generated by decomposing the plasma processing gas may be changed by changing an on/off ratio (duty ratio) or frequency of the pulse modulation.

For example, the duty ratio is represented by a ratio of an ON time Ton to a total time (Ton+Toff) of the ON time Ton during which the plasma power supply 224 supplies the RF power to the antenna of the plasma unit 222 and an OFF time Toff during which the plasma power supply 224 does not supply the RF power, that is, Ton/(Ton+Toff). The frequency is represented by 1/(Ton+Toff).

When changing the duty ratio, for example, the OFF time Toff may be changed in a state where the ON time Ton is fixed, the ON time Ton may be changed in a state where the OFF time Toff is fixed, or both the ON time Ton and the OFF time Toff may be changed. In the process processing step S2, after the time according to the setting of a recipe has elapsed (time t2), the supply of the RF power from the plasma power supply 224 to the antenna of the plasma unit 222 is stopped.

The plasma control method illustrated in FIG. 4 changes the duty ratio or frequency of the pulse of the RF power supplied from the plasma power supply 224 to the antenna of the plasma unit 222 during the process processing step S2 in each processing step of the recipe. As an example, in a first processing step of the process processing step S2, the pulse of the RF power may be supplied at a first duty ratio. In a middle processing step, the pulse of the RF power may be supplied at a second duty ratio different from the first duty ratio. In the latter processing step, the pulse of the RF power may be supplied at a third duty ratio different from the second duty ratio.

The plasma control method, according to the present embodiment, supplies the plasma processing gas into the vacuum container 1 while rotating the rotary table 2, and controls the pulse of the RF power supplied to the antenna of the plasma unit 222 according to the recipe. The plasma control method, according to the present embodiment, may change the energy distribution of ions and radicals generated by decomposing the plasma processing gas, by changing the duty ratio or frequency of the pulse of the RF power supplied to the antenna of the plasma unit 222 for each processing step according to the recipe.

Figure 5:
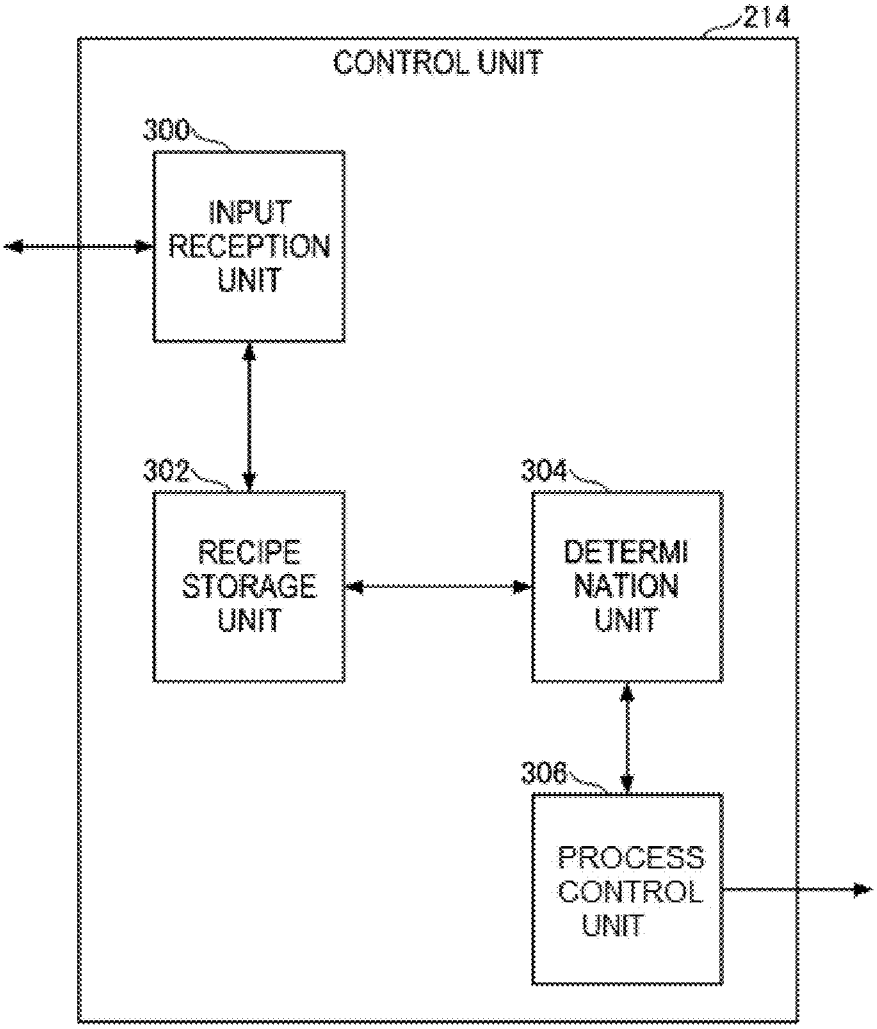
FIG. 5 is a functional configuration diagram of a control unit according to the present embodiment.

The control unit 214 of the plasma processing apparatus 200 illustrated in FIG. 2 may implement various functions illustrated in FIG. 5 by executing a processing according to a program by the computer 500 having a hardware configuration illustrated in FIG. 3.

FIG. 5 is a functional configuration diagram of the control unit according to the present embodiment. The control unit 214 illustrated in FIG. 5 includes an input reception unit 300, a recipe storage unit 302, a determination unit 304, and a process control unit 306. The recipe storage unit 302 may be implemented by the auxiliary storage unit 508, or may be implemented by a recording device that is communicably connected via a network.

The input reception unit 300 receives an input of a recipe in which values of a plurality of parameters for performing a film forming processing in the process unit 220 are set for each processing step from an operator. The recipe storage unit 302 stores the recipe, the input of which has received by the input reception unit 300 from the operator.

The determination unit 304 reads out the recipe from the recipe storage unit 302. When the plurality of parameters of the recipe include a variable parameter, the determination unit 304 determines a value of the variable parameter as described below, based on the progress state of the film forming processing. The progress state of the film forming processing refers to, for example, an estimated cumulative film thickness of the wafer W calculated from the flow rate of the gas supplied to the process unit 220. The determination unit 304 may determine the value of the variable parameter to improve, for example, the uniformity of an in-plane estimated cumulative film thickness of the wafer W.

The variable parameter includes a setting item regarding a pulse of the plasma power supply 224 that supplies the pulse of the RF power to the plasma unit 222 generating a plasma within the process chamber 226 of the process unit 220. The setting item regarding the pulse includes the duty ratio or frequency of the pulse of the RF power supplied by the plasma power supply 224 to the plasma unit 222. The variable parameter includes a setting item regarding the time of the processing step.

The process control unit 306 causes the process unit 220 to control the film forming processing based on the values of the plurality of parameters other than the variable parameter set in the recipe, and the value of the variable parameter determined by the determination unit 304.

Processing

Figure 6:
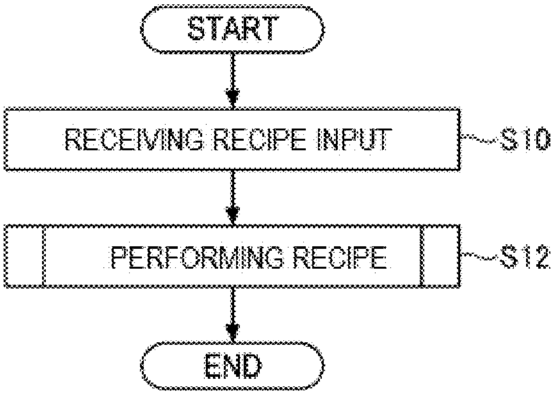
FIG. 6 is a flowchart illustrating a processing procedure for performing a film forming processing according to a recipe by the plasma processing apparatus according to the present embodiment.
Figure 8:
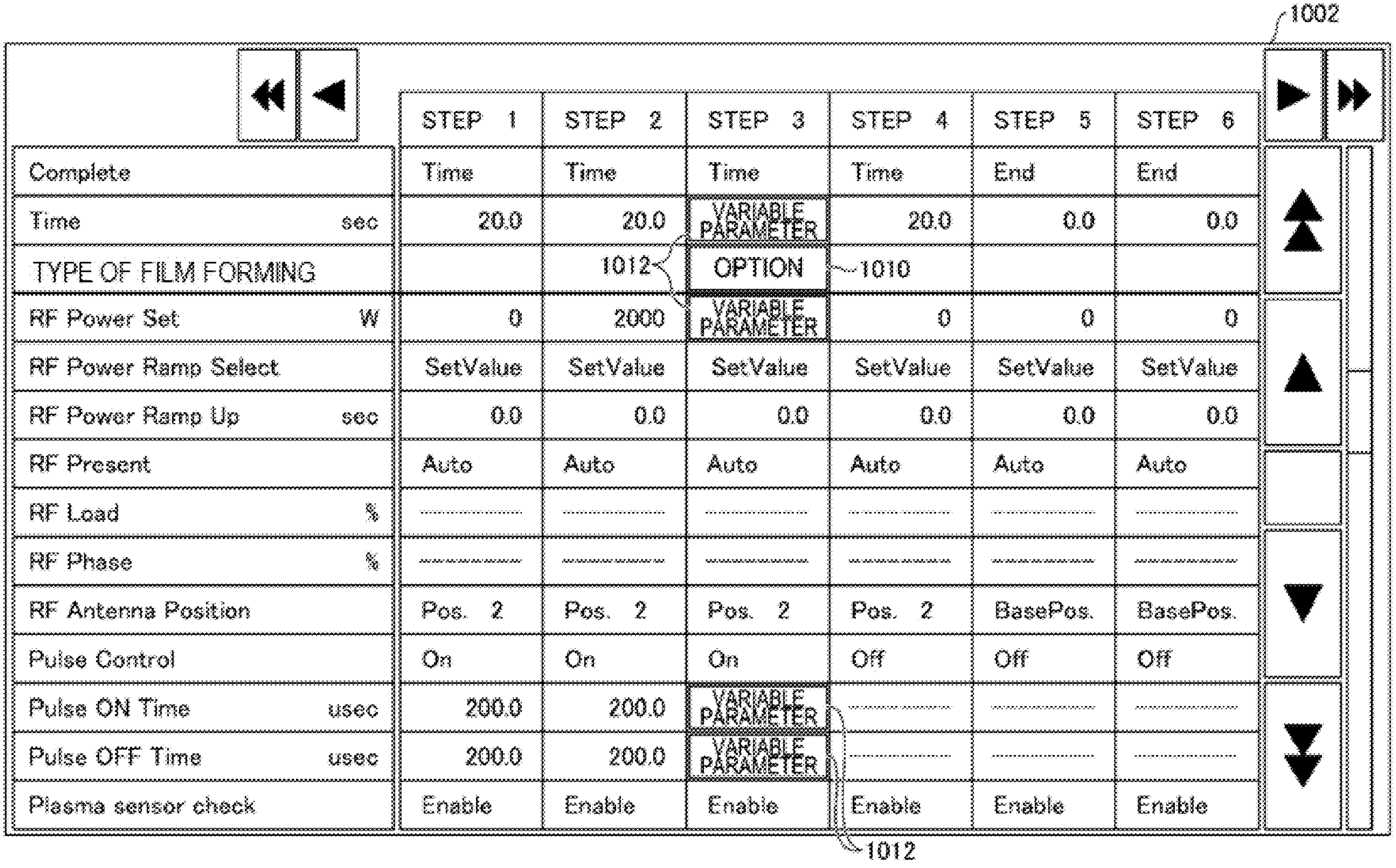
FIG. 8 is an image diagram of an example of a recipe setting screen.

The plasma processing apparatus 200, according to the present embodiment, performs the film forming processing, for example, by a procedure illustrated in FIG. 6. FIG. 6 is a flowchart illustrating a processing procedure for performing a film forming processing according to a recipe by the plasma processing apparatus according to the present embodiment. In step S10, the input reception unit 300 of the control unit 214 displays recipe setting screens 1000 and 1002 as illustrated in FIGS. 7 and 8, for example, and receives an input of a recipe from an operator. The recipe setting screens 1000 and 1002 are an example of screens for receiving an input of a recipe from an operator.

The recipe setting screens 1000 and 1002 receive a setting of values of a plurality of parameters for performing a film forming processing in the process unit 220 for each processing step, from an operator. The recipe setting screen 1000 of FIG. 7 is a screen for setting values of setting items regarding flow rates of gases supplied to the process chamber 226, which are an example of a plurality of parameters, for each processing step. The recipe setting screen 1002 of FIG. 8 is a screen for setting values of setting items regarding pulses of RF power supplied by the plasma power supply 224 to the plasma unit 222, which are an example of a plurality of parameters, for each processing step.

The recipe setting screens 1000 and 1002 illustrated in FIGS. 7 and 8 include an option 1010 that may set the type of film forming processing for each processing step. The operator may set the type of film forming processing from the option 1010 of the recipe setting screens 1000 and 1002 illustrated in FIGS. 7 and 8, for each processing step for selecting a variable parameter. The type of the film forming processing includes film forming and cleaning.

The recipe setting screens 1000 and 1002 illustrated in FIGS. 7 and 8 may select a variable parameter 1012 from the plurality of parameters for each processing step. The operator may select a variable parameter by the option, or may select a variable parameter by inputting, for example, "variable" as a parameter value. The plurality of parameters included in the recipe may include a setting item that may not be selected as the variable parameter.

The variable parameter 1012 is a parameter that changes its value based on the progress state of the film forming processing after the film forming processing has been started according to the recipe. For example, the recipe setting screens 1000 and 1002 illustrated in FIGS. 7 and 8 select some of the setting items regarding the time of the processing step and the setting items regarding the pulses of the RF power supplied by the plasma power supply 224 to the plasma unit 222 as the variable parameters 1012.

The recipe storage unit 302 of the control unit 214 displays, for example, the recipe setting screens 1000 and 1002 illustrated in FIGS. 7 and 8, and stores a recipe, the input of which has received from the operator. Returning to step S12 of FIG. 6, the determination unit 304 and the process control unit 306 of the control unit 214 cause the process unit 220 to perform the film forming processing according to the recipe stored in the recipe storage unit 302, for example, as illustrated in FIG. 9.

Figure 9:
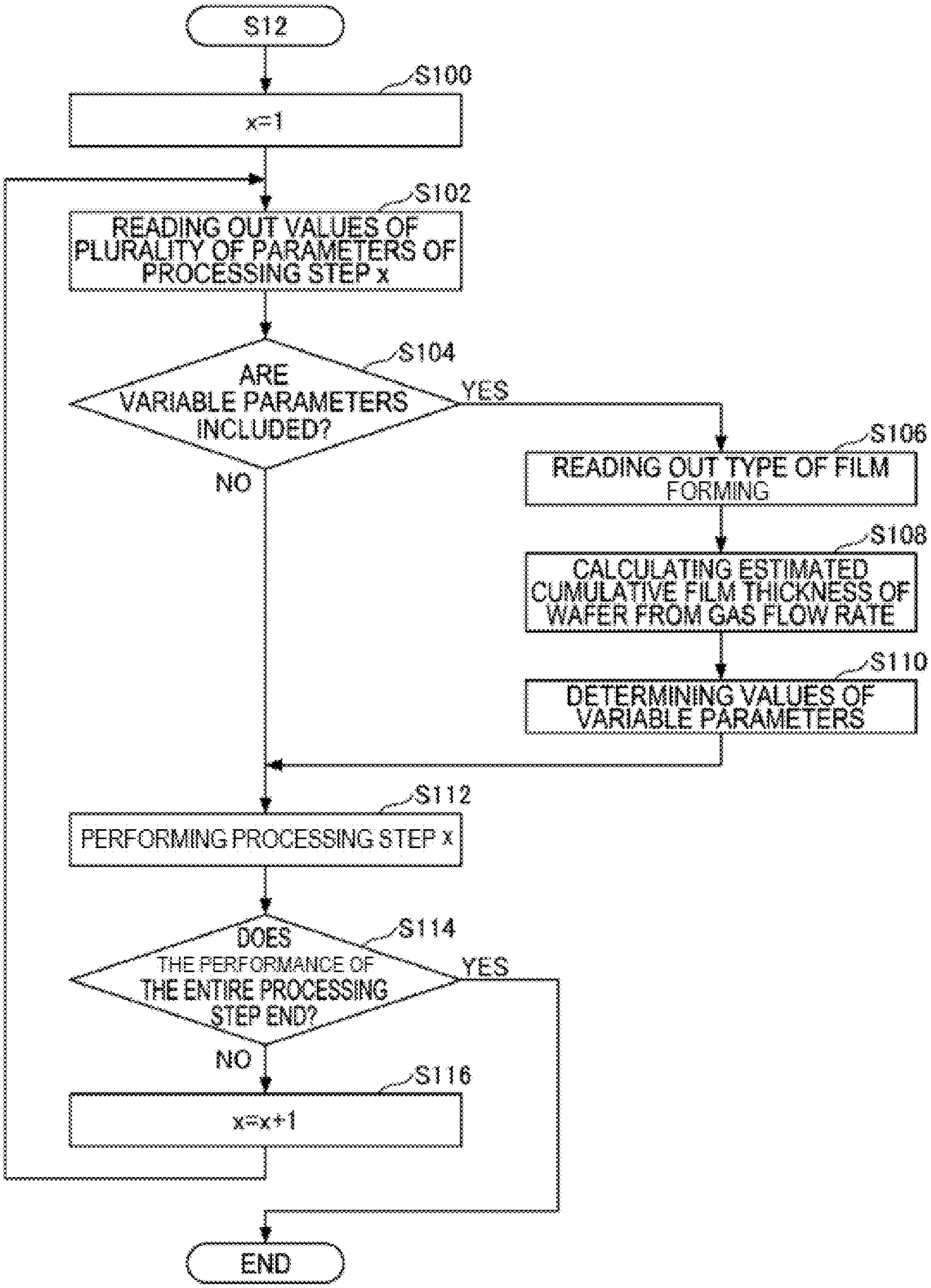
FIG. 9 is a flowchart illustrating a processing procedure of step S12.

FIG. 9 is a flowchart illustrating a processing procedure of step S12. In step S100, the determination unit 304 of the control unit 214 assigns "1" to variable x for sequentially reading out the processing steps from the recipe stored in the recipe storage unit 302. The variable x represents the order of the processing steps of the recipe to be executed or the processing steps of the recipe, which is being executed, and is an example of information illustrating the progress state of the film forming processing.

In step S102, the determination unit 304 reads out the values of the plurality of parameters of a x-$^{th}$ variable processing step of the recipe stored in the recipe storage unit 302.

In step S104, the determination unit 304 determines whether the plurality of parameters read out in step S102 include a variable parameter. When the plurality of parameters read out in step S102 include the variable parameter, the determination unit 304 proceeds to a processing of step S106.

In step S106, the determination unit 304 reads out the type of the film forming processing from the plurality of parameters read out in step S102. In step S108, the determination unit 304 calculates the estimated cumulative film thickness of the wafer from the flow rates of the gases supplied to the process chamber 226 and the type of the film forming processing in the processing steps up to a (x−1$^{th}$) variable. Since a method of calculating the estimated cumulative film thickness of the wafer from the flow rates of the gases supplied to the process chamber 226 and the type of the film forming processing is a conventional technique, the description thereof is omitted. The estimated cumulative film thickness of the wafer is an example of information indicating the progress state of the film forming processing.

In step S110, the determination unit 304 determines the value of the setting item selected as the variable parameter based on the type of the film forming processing read out in step S106 and the progress state of the film forming calculated in step S108. The determination unit 304 may use other values that may be acquired during the performance of the film forming processing according to the recipe to determine the values of the variable parameters.

For example, the determination unit 304 may determine the value of the variable parameter using a table where the type of the film forming processing read out in step S106 and the progress state of the film forming processing calculated in step S108 correspond to the value of the variable parameter. The determination unit 304 may determine the value of the variable parameter using calculation from the type of the film forming processing read out in step S106 and the progress state of the film forming processing calculated in step S108.

The determination unit 304 may determine the value of the variable parameter to improve the uniformity of the in-plane estimated cumulative film thickness of the wafer W. For example, when the variable parameter is a setting item regarding the pulse of the RF power supplied to the antenna of the plasma unit 222, the duty ratio or frequency of the pulse of the RF power is determined as the value of the variable parameter so as to improve the uniformity of the in-plane estimated cumulative film thickness of the wafer W.

The determination unit 304 proceeds to a processing of step S112, subsequent to step S110. When no variable parameter is included in the plurality of parameters read out in step S102, the determination unit 304 proceeds to the processing of step S112, subsequent to S104.

In step S112, the process control unit 306 causes the process unit 220 to perform the film forming processing of the x-$^{th}$ variable processing step, based on the values of the plurality of parameters read out in step S102 and the value of the variable parameter determined in step S110.

In step S114, the determination unit 304 determines whether the performance of all processing steps of the recipe has been completed.

When it is determined that the performance of all processing steps of the recipe has not been completed, the determination unit 304 proceeds to a processing of step S116, adds “1” to the variable x for sequentially reading out the processing steps from the recipe stored in the recipe storage unit 302, and then, returns to the processing of step S102. When it is determined that the performance of all processing steps of the recipe has been completed, the determination unit 304 terminates the processes illustrated in FIG. 9.

As described above, according to the plasma processing apparatus 200 of the present embodiment, a variable parameter that changes the value based on the progress state of the film forming processing may be set in the recipe in which the values of a plurality of parameters are set for each processing step. For example, by selecting a setting item regarding the pulse of the RF power of the plasma power supply 224 included in the recipe as the variable parameter, the plasma processing apparatus 200 according to the present embodiment may precisely control the pulse of the RF power of the plasma power supply 224, based on the progress state of the film forming processing. Therefore, the plasma processing apparatus 200, according to the present embodiment, may adjust the amount of energy appropriately according to the progress state of the film forming processing while reducing damage to the process unit 220 when using a plasma, and may improve low particle formation and film forming uniformity.

Other Embodiments

Figure 10:
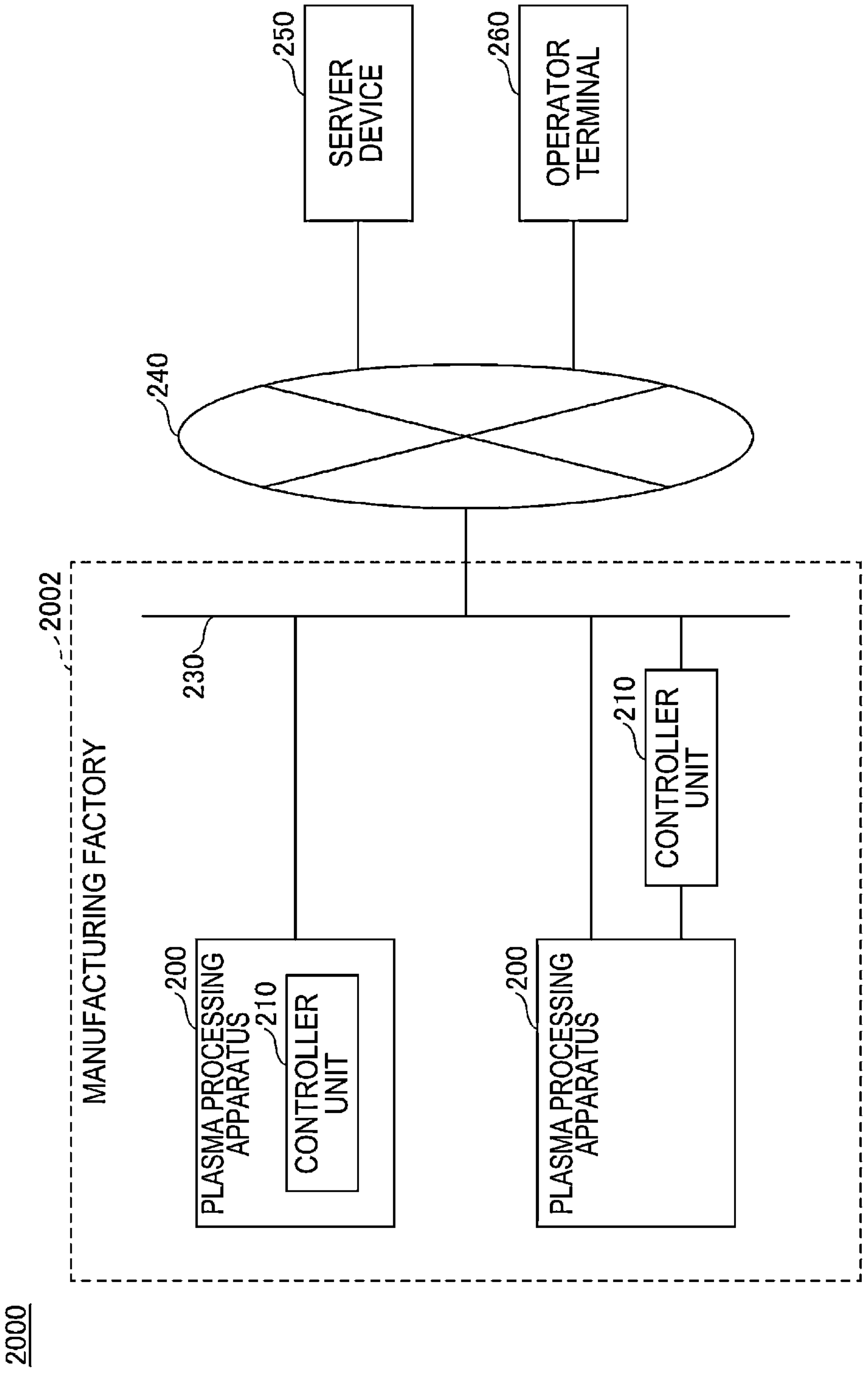
FIG. 10 is a configuration diagram of a plasma processing system according to an embodiment of the present disclosure.

The plasma processing apparatus 200, according to the present embodiment, may be implemented by, for example, a plasma processing system 2000 illustrated in FIG. 10.

FIG. 10 is a configuration diagram of a plasma processing system according to an embodiment of the present disclosure. The plasma processing system 2000 of FIG. 10 has a configuration in which one or more plasma processing apparatuses 200 installed in a manufacturing factory 2002, a server device 250, and an operator terminal 260 are communicatively connected through a network 230 such as a local area network (LAN) and a network 240 such as the Internet as a communication path.

FIG. 10 illustrates a plasma processing apparatus 200 including the controller unit 210 therein and a plasma processing apparatus 200 whose controller unit 210 is disposed outside the plasma processing apparatus 200. The server device 250 may have a functional configuration illustrated in FIG. 5. The server device 250 may control the film forming processing of the plasma processing apparatus 200 of the manufacturing factory 2002 according to processes of the flowcharts illustrated in FIG. 6 and FIG. 9.

For example, in FIG. 10, an example of one server device 250 is illustrated, but a plurality of server devices 250 may be used. The functions of the server device 250 may be distributed and installed in multiple computers, or may be installed in a cloud computer.

The operator terminal 260 is an information processing terminal operated by an operator. The information processing terminal is, for example, a personal computer (PC), a tablet terminal, or a smartphone. The operator may input a recipe by remotely connecting the operator terminal 260 to the controller unit 210 or server unit 250 of the plasma processing apparatus 200.

As described above, according to the present embodiment, the setting item of the duty ratio or frequency of the pulse of the RF power supplied to the plasma unit 222 may be added to the setting items of the recipe for performing the processing in the process unit 220. In addition, according to present embodiment, from the setting item of the recipe for performing the processing in the process unit 220, the setting item (e.g., variable parameter) whose value changes based on the progress state of the processing being performed according to the recipe (e.g., estimated cumulative film thickness) may be selected.

For example, in the present embodiment, the plasma processing apparatus 200 has been described by way of example, but the present disclosure is not limited thereto. The present embodiment may also be applied to a processing apparatus such as a semiconductor manufacturing apparatus, a substrate processing apparatus, or a heat treatment apparatus, which performs a processing according to the values of the plurality of parameters included in the recipe. In the present embodiment, the plasma processing apparatus 200 for a single-wafer processing has been described by way of example, but the plasma processing apparatus 200 may also be applied to a batch type processing apparatus.

According to the present disclosure, the value of the parameter of the recipe may be varied based on the progress state of the film forming processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma control method comprising:
- providing a plasma processing apparatus including:
  - a control unit including a user interface; and
  - a process unit including a process chamber,
- receiving, by the control unit, an input of a recipe in which values of a plurality of parameters are set for each processing step;
- receiving, by the control unit, a designation from an operator of at least one of the plurality of parameters as a variable parameter in the recipe, wherein a specific value of the variable parameter is not pre-set in the recipe;
- determining, by the control unit, a value of the variable parameter based on a progress state of the film forming processing; and
- performing, by the process unit, a film forming processing in the process unit, based on the values of the plurality of parameters set in the recipe and the value of the variable parameter determined in the determining.

2. The plasma control method according to claim 1, wherein the variable parameter includes a setting item regarding a pulse of a plasma power supply that supplies a pulse of radio-frequency (RF) power to a plasma generator within the process chamber of the process unit.

3. The plasma control method according to claim 2, wherein the determining the value of the variable parameter includes:
- determining a value of the setting item regarding the pulse to improve uniformity of an in-plane estimated cumulative film thickness of a wafer.

4. The plasma control method according to claim 3, wherein the setting item regarding the pulse includes a duty ratio or frequency of the pulse.

5. The plasma control method according to claim 2, wherein the variable parameter includes a setting item regarding a time of each of the processing steps.

6. The plasma control method according to claim 1, wherein the progress state of the film forming processing includes an estimated cumulative film thickness of a wafer calculated from a flow rate of a gas supplied to the process unit and a type of the film forming processing, or an order of the processing steps of the recipe being executed.

7. The plasma control method according to claim 1, wherein the receiving the input of the recipe includes:
- displaying a screen serving as the user interface for receiving the input of the recipe from an operator,
- receiving a setting of the values of the plurality of parameters displayed on the screen and a selection of the variable parameter from the operator, and
- receiving a selection of a type of the film forming processing from the operator.

8. A plasma processing apparatus comprising:
- a control unit including a user interface; and
- a process unit including a process chamber,
- wherein the control unit is configured to:
  - receive an input of a recipe in which values of a plurality of parameters for performing a film forming processing in the process unit are set for each processing step,
  - receive a designation from an operator of at least one of the plurality of parameters as a variable parameter in the recipe, wherein a specific value of the variable parameter is not pre-set in the recipe;
  - determine a value of the variable parameter based on a progress state of the film forming processing, and
  - perform the film forming processing in the process unit based on the values of the plurality of parameters set in the recipe and the determined value of the variable parameter.

9. A plasma processing system comprising:
- a control unit including a user interface; and
- a process unit including a process chamber,
  - wherein the control unit includes,
    - an input reception circuitry configured to receive an input of a recipe in which values of a plurality of parameters are set for each processing step, and receive a designation from an operator of at least one of the plurality of parameters as a variable parameter in the recipe, wherein a specific value of the variable parameter is not pre-set in the recipe,
    - a determination circuitry configured to determine a value of the variable parameter based on a progress state of the film forming processing, and
  - a process control circuitry configured to control a film forming processing in the process unit based on the values of the plurality of parameters set in the recipe and the determined value of the variable parameter.

* * * * *